US006545872B1

(12) United States Patent
Lonergan et al.

(10) Patent No.: US 6,545,872 B1
(45) Date of Patent: Apr. 8, 2003

(54) HEAT SINK FOR EDGE CONNECTORS

(75) Inventors: Kevin J. Lonergan, Monument, CO (US); Ralph M. Tusler, Monument, CO (US); Richard A. Gaudet, Colorado Springs, CO (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/977,131

(22) Filed: Oct. 12, 2001

(51) Int. Cl.[7] .................................................. H05K 7/20

(52) U.S. Cl. ....................... 361/719; 174/252; 361/720; 439/487

(58) Field of Search .......................... 174/252; 361/704, 361/707, 709–710, 719–721; 439/485, 487

(56) References Cited

U.S. PATENT DOCUMENTS

| | | | | |
|---|---|---|---|---|
| 4,313,411 A | * 2/1982 | Seytre et al. | ............... | 439/485 |
| 5,109,318 A | 4/1992 | Funari et al. | ............... | 361/388 |
| 5,184,281 A | 2/1993 | Samarov et al. | ............ | 361/386 |
| 5,353,191 A | * 10/1994 | Volz et al. | .................. | 361/690 |
| 5,371,653 A | * 12/1994 | Kametani et al. | ........... | 361/121 |
| 5,513,314 A | 4/1996 | Kandasamy et al. | | |
| 6,243,790 B1 | 3/1997 | Yorimitsu | | |
| 6,266,721 B1 | 10/1997 | Sheikh et al. | | |
| 6,237,112 B1 | 6/1998 | Yoo et al. | | |
| 5,815,371 A | 9/1998 | Jeffries et al. | .............. | 361/704 |
| 5,815,649 A | 9/1998 | Utter et al. | | |
| 5,822,777 A | 10/1998 | Leshem et al. | | |
| 5,832,222 A | 11/1998 | Dziadosz et al. | | |
| 5,835,700 A | 11/1998 | Carbonneau et al. | | |
| 6,188,973 B1 | 3/1999 | Martinez et al. | | |
| 5,987,622 A | 11/1999 | Lo Verso et al. | | |
| 5,996,089 A | 11/1999 | Mann et al. | | |
| 6,038,689 A | 3/2000 | Schmidt et al. | | |
| 6,073,209 A | 6/2000 | Bergsten | | |
| 6,148,414 A | 11/2000 | Brown et al. | | |
| 6,121,076 A1 | * 4/2001 | Maccuarrie et al. | ........ | 361/720 |
| 6,260,120 B1 | 7/2001 | Blumenau et al. | | |
| 6,278,609 B1 | 8/2001 | Suzuki et al. | ............... | 361/704 |
| 6,282,094 B1 | 8/2001 | Lo et al. | ...................... | 361/704 |
| 6,282,096 B1 | 8/2001 | Lo et al. | ...................... | 361/704 |
| 6,282,610 B1 | 8/2001 | Bergsten | | |

OTHER PUBLICATIONS

Smart Storage Inc., "SmartStor InfiNet™: Virtual Storage for Today's E–economy," Sep. 2000.

Compaq Computer Corporation, "The Compaq Enterprise Network Storage Architecture: An Overview," May 2000.

Compaq Computer Corporation, "Compaq Storage Work" Data Replication Manager HSG80 ACS V8.5P Operations Guide, Mar. 2000.

* cited by examiner

*Primary Examiner*—Gregory Thompson

(57) ABSTRACT

A heat sink assembly for use with edge connectors, e.g., card edge connectors, of cards or printed circuit boards. The heat sink assembly provides a relatively large heat transfer capacity to control temperatures in contacts of the edge connectors which increases the current rating of the connector by allowing more current to pass through the connector. The heat sink assembly includes fins attached to the edge connector power and ground leads by direct thermal connection, such as soldering, to traces in the board. The fins are connected to the power and ground leads in an alternating or interweaved fashion. The fins are fabricated from thermal conducting material and heat is conducted to the fins where it is removed by the relatively large surface area of the fins. Adjacent fins are electrically isolated such that power and ground fins do not contact.

13 Claims, 2 Drawing Sheets

HEAT SINK FOR EDGE CONNECTORS

BACKGROUND OF THE INVENTION

1. Field of the Invention

The present invention relates, in general, to systems and methods of dissipating heat from electronic components, and more particularly, to a heat sink assembly for use with an edge connector, such as connectors used with PC cards, printed circuit boards, and the like, that includes a plurality of fins connected to power and ground traces to conduct heat away from the edge connector contacts.

2. Relevant Background

In the computer industry, there is a continuing demand for improvements in electrical devices, such as power supplies, to enhance performance while also trying to reduce size of components. Many of these electrical devices are provided using integrated circuits or chips that are provided on printed circuit boards (PCBs). While decreasing in overall size, operating speeds, chip sizes, and numbers of transistors and other components on each printed circuit board is increasing. This leads to increased power consumption, with many chips consuming 30 watts or more of power, which in turn significantly increases the amount of heat generated by the components. Excessive heat can reduce capacity of the components and also reduce component life and reliability. As a result, many efforts have been made to control or limit heat generated during operation of the electrical components and to dissipate generated heat to reduce operating temperatures.

More specifically, many printed circuit boards, PC cards, and other thin electrical components utilize edge connectors to allow them to be plugged into a socket of another circuit board to exchange electrical signals, such as power and data signals. Typically, edge connectors generally include connectors on the edge of boards or cards made of strips of copper, gold, or other conductive metals that provide the signal, power, and ground contacts. All connectors, though, are limited in the amount of current that can be safely and effectively carried. Current flowing through the contact resistance generates heat and this raises the temperature of the contact. The temperature of each contact must be controlled to establish operating temperatures that allow reliable operation of the contact and to avoid heat damage to adjacent components.

Edge connectors in particular are designed to pass low level logic signals and not necessarily to pass higher levels of current. The current rating of edge connector contacts is typically further reduced as the ambient temperature near the connector increases. The ambient temperature is a concern in many existing edge connector designs that use a large number of parallel contacts to carry higher currents, such as in a power supply. The heat dissipating, by radiation and convection, from the contacts creates localized heating that further reduces the current that can be drawn through the edge connector.

In an attempt to control temperatures of power and ground contacts, printed circuit boards have been manufactured with continuous wiring board etches or traces between adjacent contacts. This increases the amount of surface area available to dissipate generated heat but has not been effective in meeting the continually increasing demands for higher current capacity for connectors. The demand for reduced sizes of electronic components, including edge connectors, increases the difficulty of providing additional surface area for heat transfer. For example, structural integrity is a challenge facing electronic, component manufacturers as most components are manufactured from electrically conductive material with lower mechanical strengths and with very small dimensions, e.g., a few millimeters or less in thickness. Vibration and shock can rapidly damage heat dissipation assemblies, such as metal fins, that are attached to printed circuit boards, and such assemblies are often difficult to install without damage, e.g., bending that crimps fins which reduces surface areas and can cause electrical shorting of adjacent components. Alternatively, increasing the number of contacts can sometimes be used to control individual contact temperatures but typically is not a viable option as the number of contact pairs in a connector is usually fixed.

Hence, there remains a need for an improved method and apparatus for dissipating heat from edge connectors. Preferably, such a method and apparatus would be relatively inexpensive to manufacture, would be structurally reliable, and would increase the current rating and reliability of the edge connector.

SUMMARY OF THE INVENTION

The present invention addresses the above discussed and additional problems by providing a heat sink assembly for use with typical edge connectors, e.g., card edge connectors, of cards or printed circuit boards. The heat sink assembly is adapted to provide a relatively large heat transfer capacity to control temperatures in contacts. In effect, this increases the current rating of the connector by allowing more current to pass through the connector while remaining below a preset maximum temperature. Significantly, the heat sink assembly includes a plurality of fins that are attached to the edge connector leads, such as the power and ground leads, through direct thermal connection to traces in the board. In a preferred embodiment, the fins are connected to the power and ground configuration in an alternating or interweaved fashion, such as with a pair of power leads being connected to a first fin and a pair of ground leads being connected to a second fin and so on across the edge connector. The fins are fabricated from thermal conducting material, such as copper, and heat is conducted to the fins where it is removed by convection and/or radiation due to the relatively large surface area of the fins. Since current is also conducted to the fins, adjacent fins are electrically isolated within the heat sink assembly such that power and ground fins do not come in contact.

More particularly, a printed circuit board with enhanced heat dissipation, and therefore, higher current rating is provided that includes a board with an edge connector. The edge connector is made up of a plurality of power leads and ground leads. Traces or conductor lines are provided in the board and are connected to the leads to pass current between the leads and other devices on the board. A heat sink assembly is mounted on the board to dissipate the heat generated by the leads and is thermally connected to the traces to create a heat transfer path away from the power and ground leads. In one embodiment, the power leads are positioned in one layer or surface of the board and the ground leads are positioned in a second layer or surface of the board. Slots are provided in the board for receiving contacts of the heat sink assembly, which allows connection to traces in either of the two layers. In a preferred embodiment, the heat sink assembly includes a plurality of fins and the fins are alternatively connected to power and ground leads. The heat sink assembly includes fin holders with base members having slots for receiving tips of the fins and isolation members between the slots for electrically isolating adjacent fins which are oppositely charged by the traces.

DETAILED DESCRIPTION OF THE PREFERRED EMBODIMENTS

Figure 1:
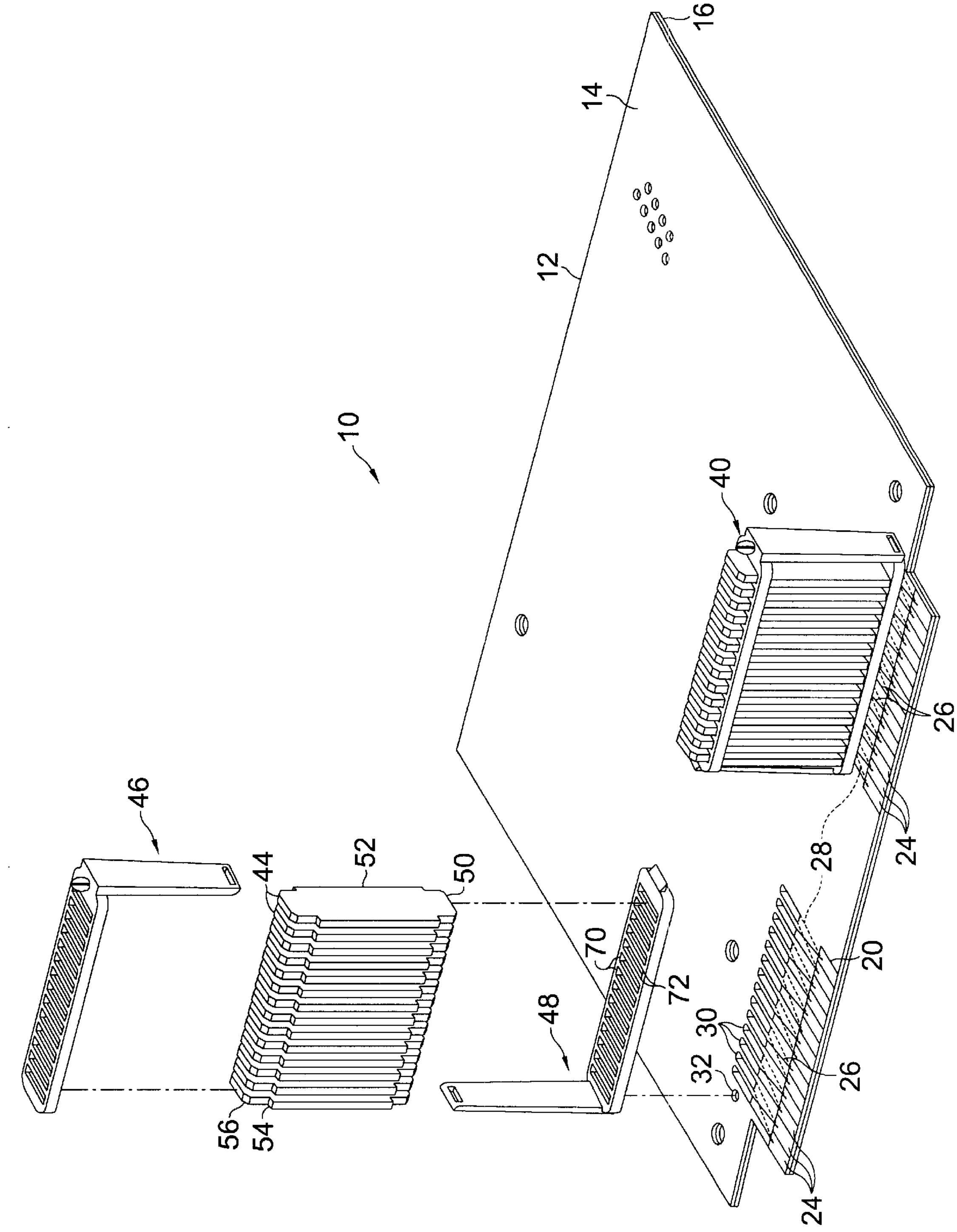
FIG. 1 is a partially exploded perspective view of a printed circuit board with edge connectors in thermal communication with heat sink assemblies according to the present invention.

FIG. 1 illustrates a printed circuit board or card 10 utilizing edge connector heat transfer features of the present invention. As will become clear, the heat transfer features are particularly suited for use with edge connectors having data, power, and ground leads along a board edge or other edge (e.g., the flat strips along an edge used in standard card edge connectors in which mating contacts are sometimes called leafs). However, the invention is not limited to such connectors, and the breadth of the following description is intended to cover other connectors that use contacts to transfer power between electrical components and for which heat generation is a concern in obtaining a desired current rating.

As shown in FIG. 1, the printed circuit board 10 includes a board 12 having top and bottom surfaces 14 and 16, respectfully. To allow the board 12 to be electrically connected with other components of an electrical device, such as a computing device, the board 12 includes edge connectors 20 that are adapted to allow data and power to be passed to a connecting device or board. For example, the edge connectors 20 or edge may be inserted into a female edge connector or socket which in turn is plugged or otherwise connected to a mating component to supply power and/or to enable data transfer. In this regard, the edge connectors 20 include a plurality of leads 24 fabricated of an electrically conductive material, such as copper, gold, and the like. The number and specific arrangement of the leads 24 can be widely varied to practice the invention.

As shown, the leads 24 are used for power and ground but in many embodiments data leads are included without connection to the heat sink members (such as by running data traces between fins or heat transfer connections). Further, in the specific embodiment shown, the contacts or leads 24 are paired to carry currents that exceed the rating of a single contact but the invention is also useful with connectors in which each lead 24 has a dedicated trace. Referring again to FIG. 1, the leads 24 in the top surface 14 are typically all power or ground leads with the leads (not shown) in the bottom surface 16 being the opposite leads (i.e., ground leads if the leads 24 in the top surface 14 are power leads).

According to an important aspect of the invention, the leads or contacts 24 are placed in direct contact with heat transfer elements, e.g., fins, active heat transfer sinks, and the like such that excess heat is transferred rapidly from the leads 24 to control the operating temperatures. In this regard, the board 12 includes slots 30 for receiving the heat transfer elements. The leads 24 are connected to the slots 30 with electrically conductive traces 26 in the top surface 14 and with traces 28 in the bottom surface 16. Hence, in a preferred embodiment, the slots 30 extend through both the top and bottom surfaces 14, 16 to place the heat transfer elements in direct contact with the traces 26, 28 which generally extend (not shown) past the slots 30 to other devices (not shown) on the board 12. As will be explained in more detail, the thermal (and electrical) contact is typically achieved by soldering the heat transfer elements to the traces 26, 28 but other suitable connection techniques may be used, such as well-known mechanical fastening methods including press fitting.

Temperature control is provided by the inclusion of a heat sink assembly 40 which is placed in heat conducting contact with the board 12 and more importantly, with the traces 26, 28 extending from the edge connectors 20. As shown, a heat sink assembly 40 is provided for each edge connector 20 but in some embodiments, it is useful to provide a single larger heat sink. To assist in positioning the heat sink assembly 40, a hole 32 is provided in the board 12 to mate with a post 64 on the assembly 40. The heat sink assembly 40 is configured to provide a relatively large surface area for convective heat transfer with surrounding air. To this end, the heat sink assembly 40 includes a number of fins 44 that are thermally connected to the traces 26, 28 upon installation on the board 12. The fins 44 may be fabricated from numerous materials, such as metals, with high thermal conductivities, and preferably, from a metal that is suitable for contact and bonding with the traces 26, 28(such as by soldering).

The heat sink assembly 40 is preferably configured to provide structural integrity while also providing electrical isolation between electrically conductive fins 44. Structural integrity is a concern due to the size of the individual components. Upon installation, the fins 44 will conduct electricity from the traces 26, 28 and must not be allowed to be crimped or bent into contact. In one embodiment, structural integrity is enhanced by providing a number of fins 44 that are positioned within the heat sink assembly 40 by an upper fin holder 46 and a lower fin holder 48.

The fins 44 may be fabricated with a variety of shapes and sizes that suit space constraints of a particular printed circuit board 10 or edge connector 20 design. For example, the fins 44 may have numerous cross-sections including planar, S-shaped, W-shaped, and the like. The materials used for the fins 44 preferably are selected to have a relatively high thermal conductivity while also allowing easy assembly of the printed circuit board 10 and connection with the traces 26, 28. For example, in one embodiment, the fins 44 are fabricated from copper, gold, and other materials used for traces 26, 28, and more preferably from copper that is pre-plated with tin electroplate to facilitate soldering to the traces 26, 28.

Figure 2:
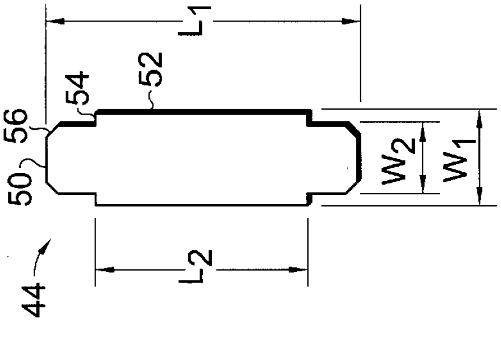
FIG. 2 is an elevation view of a heat transfer fin used in the heat sink assemblies of FIG. 1.

FIG. 2 illustrates a preferred planar fin 44 design in which the fin 44 includes a contact tip 50 for providing a bonding surface to the traces 26, 28 and a thermal path to the rest of the fin 44 surfaces. Adjacent to the contact tip 50 is the heat transfer portion 52 of the fin 44, which is typically fully exposed to ambient air to provide a large convective heat transfer surface. To facilitate insertion and mating with the upper and lower fin holders 46, 48, the fin 44 includes shoulders 54 for extending beyond the slots 70 in the holders 46, 48 and the tips 50 typically may have rounded corners 56 to account for manufacturing tolerances and ease assembly. The specific dimensions of the fin 44 may be varied widely to practice the invention. The tip 50 preferably extends outward from the heat transfer portion 52 to allow thermal contact with the traces 28 in the bottom surface 16 of the board 12 (e.g., about the thickness of the board 12 plus the thickness of the lower fin holder 48).

To illustrate the difficulty in maintaining structural integrity of the heat sink assembly 40, one embodiment of the fin 44 calls for the overall length, $L_1$, to be between 1 and 2 inches, the heat transfer length, $L_2$, to be less than 1 inch, the overall width, $W_1$, to be less than 0.5 inches, the tip width, $W_2$, to be less than about 0.4 inches, and the thickness to be less than about 0.05 inches (i.e., less than 2 millimeters). While providing a large extended heat: transfer area, without structural support, these fins 44 may readily become deformed during fabrication or even vibrate during operation to an extent that could cause shorting.

Figure 3:
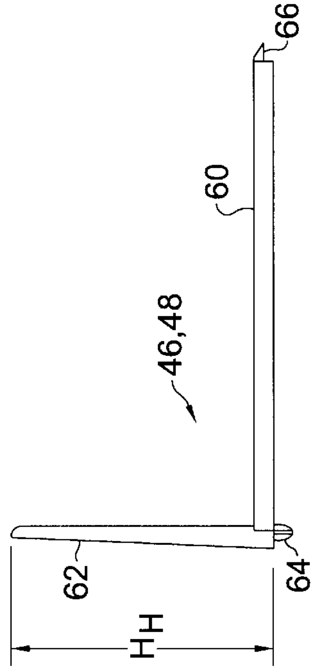
FIG. 3 is an elevation view of a fin holder used in the heat sink assemblies of FIG. 1 to structurally support and position the fins and to electrically isolate adjacent fins.
Figure 5:
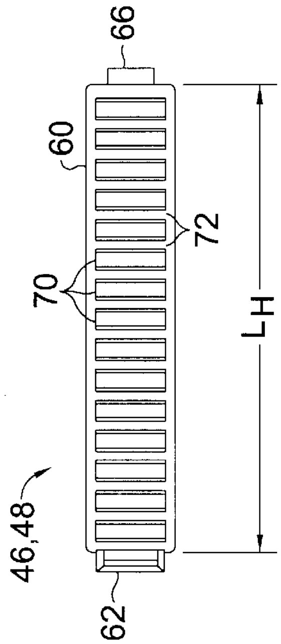
FIG. 5 is a top view of the fin holder of FIG. 3 illustrating fin receiving slots in the base of the holder and electrical isolation cross members between the slots.
Figure 4:
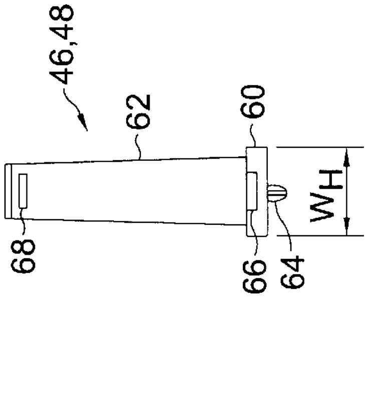
FIG. 4 is a side elevation view of the fin holder of FIG. 3 illustrating features that facilitate assembly of the heat sink assemblies and installation on the board of FIG. 1.

To provide structural support and electrical isolation of the fins 44, the heat sink assembly 40 includes the upper and lower fin holders 46, 48 as shown in FIGS. 3–5. To reduce the cost of fabrication and later assembly, the upper and lower fin holders 46, 48 have identical manufacturing dimensions in a preferred embodiment and, similarly, the fins 44 are symmetrically designed. However, it will be understood that the invention is not limited to the illustrated arrangement and numerous shapes and arrangements of fins 44 and structural supports may be utilized to provide desired structural and electrical characteristics.

As shown, the holders 46, 48 include a base member 60 and a side member 62 that are positioned substantially perpendicular to the base member 60 (and parallel to the installed fins 44). The base member 60 has a length, $L_H$, that is generally at least the length of the edge connector 20 (such as less than about 2 inches) and a width, $W_H$, that is at least as large as the fin width, $W_1$, (such as less than about 0.5 inches) shown in FIG. 2. The side member 62 has a height, $H_H$, that is slightly larger than the length of the fin heat transfer portion, $L_2$, (such as about 1 inch or less) and more specifically, is selected such that when assembled the shoulders 54 of the fins 44 contact the base members 60 of the upper and lower fin holders 46, 48. To enable the upper and lower fin holders 46, 48 to be interconnected, a tongue or tip 66 is provided on the end of the base member 60 and a groove or hole 68 is provided in the side member 62. A post 64 is provided on the base member 60 to facilitate placement and bonding of the assembly 40 to the board 12, and during assembly of the printed circuit board 10, the post 64 mates with hole 32 in the board 12.

Assembly of the heat sink fin assembly 40 simply involves placing each of the fins 44 within the slots 70 of the lower fin holder 48. Assembly is completed by placing the upper contact tip 50 of the fins 44 into the slots 70 of the upper fin holder 46 and snapping the tongues 66 of the upper and lower fin holders 46, 48 into the grooves 68 of the lower and upper fin holders 48 and 46, respectively. When assembled, the heat sink assembly 40. provides structural support for the readily deformed fins 44 at both ends of the heat transfer portion 52 of the fins 44 (i.e., by encasing at least a portion of the upper and lower contact tips 50). As will be appreciated, the assembled heat sink assembly 40 can be manufactured and distributed as a standalone part that can later be inserted and thermally connected to the edge connector of a board or other electronic device.

According to a significant feature of the invention, the heat sink assembly 40 is adapted to electrically isolate adjacent fins 44 within the assembly 40. As discussed above, in a preferred embodiment, the fins 44 in the assembly 40 are alternatively connected to ground and power traces 26, 28 (i.e., power fin 44, ground fin 44, power fin 44, and so on). Clearly, it is important that adjacent fins 44 do not come into contact to prevent electrical shorting or at least significantly reduce the likelihood of such shorting. In some embodiments, the fins 44 themselves may be configured with electrical isolators or insulators integrally provided such-as at the tips 50 or other surfaces for which contact with-adjacent fins 44 is a concern. In more preferred embodiments, such as the assembly 40 shown, the fin holders 46, 48 are adapted to provide the desired electrical isolation of adjacent fins 44.

As illustrated in FIGS. 1 and 5, the bases 60 of each holder 46, 48 include electrical isolation members or electrical insulators 72. These members 72 are positioned as cross members between each slot 70 to provide structural support to the fins 44 and provide an isolation distance between adjacent fins 44. The distance, i.e., the thickness of each member 72, is preferably selected to be large enough to allow air to readily flow between the fins 44 and across the heat transfer portions 52 while being small enough to limit the overall size of the heat sink assembly 40. For example, in preferred embodiments, the overall length of the holders, $L_H$, is about the length of the edge connector 20 or slightly longer so as to position the fins 44 substantially adjacent the leads 24 to minimize the required lengths of the traces 26, 28 needed to provide thermal connection with the slots 30 and fins 44. The thickness of each member 72 is also selected to minimize the risk of arcing between adjacent fins 44 and may depend on the power and/or current levers in the leads 24. For illustration purposes, but not as a limitation, the thickness of the members 72 will typically be less than about ⅛ inch to provide adequate electrical isolation and adequate separation to provide a channel or pathway for air to flow to obtain adequate convective heat transfer from the heat transfer portion 52 of the fins 44.

The holders 46, 48 may be manufactured from a variety of materials according to the invention. In one preferred embodiment, manufacturing costs are reduced by fabricating the holders 46, 48 as a single piece from a material that is selected based on its electrical insulation properties, resistance to heat, and structural strength. Many readily available plastics may be utilized to provide these desired properties, such as plastic resins reinforced with glass or other materials. The holders 46, 48 may also be manufactured as assemblies of one or more parts with the bases 60 being fabricated-from an electrical insulator material.

Note, for electrical isolation, a single fin holder (such as lower fin holder 48) or even a single base (such as base 60 of lower fin holder 48) may be utilized to isolate adjacent fins 44. For example, in some embodiments, the upper fin holder 46 may be eliminated (and even the side member 62 of lower fin holder 48) to practice the invention. In this embodiment, structural integrity may be enhanced by selecting fins 44 having a shorter heat transfer portion length, L2, and/or by increasing the thickness of the fins 44. This alternative embodiment may further include electrical isolators (not shown) at upper portions of the fins 44 that encase or wrap around the upper contact tips 50 or, as discussed previously, the fins 44 themselves may include electrical isolation members that contact each other on adjacent fins.

Assembly of the printed circuit board 10 includes first assembling the heat sink assembly 40 and fabricating a board 12 with power traces 26 and ground traces 28 contacting edges of fin receiving slots 30. The number of traces 26, 28 thermally linked to each slot may vary from less than one per slot 30 to a plurality of traces 26, 28 to each slot 30. The assembled heat sink assembly 40 is then inserted into the board 12 as shown in FIG. 1 with plug 64 inserted into hole 32 and lower contact tips 50 of the fins 44 inserted into slots 30. Thermal connection may be achieved simply with the physical insertion of the tips 50 into a tightly fit or low tolerance slot 30 to tip 50 design. In this arrangement, mechanical fasteners, such as screws and the like, (not shown) can be used to rigidly connect the assembly 40 to the board 10. More preferably, the contact tips 50 are bonded to the traces 26, 28 by soldering (e.g., wave soldering) or other well-known techniques to produce a more efficient thermal connection point and heat transfer pathway between the leads 24 and the heat transfer portions 52 of the fins 44. To enhance the solderability of the fins 44, the fins 44 may be plated, such as with tin electroplate, in a secondary plating step after stamping the fins 44 from copper, aluminum, or other metallic sheets. The fins 44 may also be stamped or cut from pre-plated material.

In the above manner, the heat sink assemblies 40 increase the current rating of the edge connectors 20 of the printed circuit board 10. This is achieved by decreasing the size of the temperature rise experienced during operation of the printed circuit board 10 when current is flowing through the leads 24. For example, in a power supply implementation of the invention, the use of the heat sink assemblies 40 shown in FIG. 1 allowed the total current through the parallel leads 24 to be raised from 20 amps (which is typical of many conventional edge connectors) to 30 amps. This 50 percent increase was achieved with a smaller temperature rise than when 20 amps were delivered without the installation of the heat sink assemblies 40 and was achieved without the need for increasing the number of leads 24.

Although the invention has been described and illustrated with a certain degree of particularity, it is understood that the present disclosure has been made only by way of example and that numerous changes in the combination and arrangement of parts can be resorted to by those skilled in the art without departing from the spirit and scope of the invention, as hereinafter claimed. For example, some electrical devices may be configured to allow fins to extend outward from both sides of the board 12. In these devices, an alternative embodiment for printed circuit board 10 may include having a heat sink thermally connected to each side of the board 12 to the differing leads. Hence, electrical isolation is achieved by connecting power traces 26 to one heat sink and ground traces 28 to a heat sink on the opposite side of the board 12. In this embodiment, the heat sink may be fabricated entirely of a thermal conductive metal without concern for electrical isolation or with electrical isolators to reduce risk of shorting to nearby components (such as with edge and tip guards fabricated of rubber or plastic).

Numerous heat sink assemblies may be used to provide the desired heat transfer away from the edge connector leads 24. The invention includes devices that vary from the heat sink assembly 40 but are thermally, and electrically, connected to the leads 24, via traces 26, 28 or otherwise. For example, a fan may be provided to increase convection from the fins 44. The fins 44 may be replaced with active heat transfer or heat sink devices or with passive devices that provide enlarged heat transfer surfaces.

We claim:

1. A heat sink for use with a printed circuit board having power and ground traces for transferring current, comprising:

means for conducting heat from power traces of a printed circuit board, the power traces heat conducting means being connected to the power traces to create a heat transfer pathway away from the power traces;

means for conducting heat from ground traces of the printed circuit board, the ground traces heat conducting means being connected to the ground traces to create a heat transfer pathway away from the ground traces; and means for dissipating heat in thermal communication with the heat transfer pathways from the power and ground traces, wherein the heat dissipation means comprises a number of heat transfer elements and wherein the heat transfer elements in communication with the heat transfer pathway away from the power traces are electrically isolated from the heat transfer elements in communication with the heat transfer pathway away from the ground traces;

wherein the heat dissipation means comprises a number of heat transfer elements and wherein the heat transfer elements in communication with the heat transfer pathway away from the power traces are electrically isolated from the heat transfer elements in communication with the heat transfer pathway away from the ground traces;

wherein the heat transfer elements comprise fins arranged side by side and further wherein adjacent ones of the fins are in thermal communication with differing ones of the heat transfer pathways; and wherein the heat dissipation means includes isolation members adapted for providing the electrical isolation at each end of the fins.

2. An apparatus for dissipating heat generated by ground and power leads of an edge connector, comprising:

a first heat dissipation assembly adapted for dissipating heat and including contacts for thermal connection to the power leads; and a second heat dissipation assembly adapted for dissipating heat and including contacts for thermal connection to the ground leads;

wherein the first and second heat dissipation assemblies comprise a plurality of fins each having a heat transfer portion, the fins including the contacts for bonding with an electrical trace connected to one of the leads, and wherein adjacent ones of the fins are connected to the power and the ground leads, and the first and second heat dissipation assemblies further including a plurality of isolation members positioned between the adjacent ones of the fins to electrically isolate each pair of adjacent fins.

3. The apparatus of claim 2, wherein the bonding comprises soldering.

4. The apparatus of claim 2, wherein the fins comprise copper with tin electroplating.

5. An apparatus for dissipating heat generated by ground and power leads of an edge connector, comprising:

a first heat dissipation assembly adapted for dissipating heat and including contacts for thermal connection to the power leads; and a second heat dissipation assembly adapted for dissipating heat and including contacts for thermal connection to the ground leads;

wherein the first and second heat dissipation assemblies comprise a plurality of fins each having a heat transfer portion and further include a lower fin holder having a base with slots configured to receive first ends of the fins and an upper fin holder having a base with slots configured to receive second ends of the fins.

6. The apparatus of claim 5, wherein the bases include isolation members between the slots comprising an electrical insulator material.

7. A printed circuit board with enhanced heat dissipation, comprising:

a board;

an edge connector on the board comprising a plurality of power leads and a plurality of ground leads;

electrically conducting traces on the board connected to the leads for passing current to or from the power and ground leads; and a heat sink assembly mounted on the board configured to dissipate heat, wherein the heat sink assembly is thermally and electrically connected to at least a portion of the traces to create a path for conducting heat from the power and ground leads to the heat sink assembly and wherein the heat sink assembly includes contacts for bonding to the traces and wherein the board includes slots for receiving the contacts, the traces being arranged on the board to contact an edge of the slots.

8. The printed circuit board of claim 7, wherein the board includes a first layer containing the power leads and corresponding ones of the traces and a second layer containing the ground leads and corresponding ones of the traces, the slots extending through the first and second layers.

9. A printed circuit board with enhanced heat dissipation, comprising:

a board;

an edge connector on the board comprising a plurality of power leads and a plurality of ground leads;

electrically conducting traces on the board connected to the leads for passing current to or from the power and ground leads; and a heat sink assembly mounted on the board configured to dissipate heat, wherein the heat sink assembly is thermally and electrically connected to at least a portion of the traces to create a path for conducting heat from the power and ground leads to the heat sink assembly and wherein the heat sink assembly further includes a plurality of fins alternately connected to the power and ground leads and includes isolation members between the fins comprising an electrical insulator material.

10. The printed circuit board of claim 9, wherein each of the fins is connected to two of the power leads or to two of the ground leads.

11. The printed circuit board of claim 9, wherein the heat sink assembly further includes a lower fin holder with a base for supporting the isolation members and with slots for allowing a contact tip of each of the fins to pass through the base to provide a connection point to the traces.

12. The printed circuit board of claim 11, wherein the heat sink assembly further includes an upper fin holder with a base for supporting additional ones of the isolation members and with slots for allowing an end of the fins opposite the contact tip to pass through the base to structurally support the fins.

13. The printed circuit board of claim 11, wherein the fins are fabricated from copper and plated with tin and wherein each of the contact tips is soldered to at least one of the traces.

* * * * *